(12) United States Patent
Mizoguchi

(10) Patent No.: US 7,300,217 B2
(45) Date of Patent: Nov. 27, 2007

(54) OPTICAL SEMICONDUCTOR DEVICE, OPTICAL CONNECTOR AND ELECTRONIC EQUIPMENT

(75) Inventor: Takatoshi Mizoguchi, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 159 days.

(21) Appl. No.: 11/187,960

(22) Filed: Jul. 25, 2005

(65) Prior Publication Data
US 2006/0018608 A1 Jan. 26, 2006

(30) Foreign Application Priority Data
Jul. 26, 2004 (JP) .......................... P2004-217100

(51) Int. Cl.
G02B 6/36 (2006.01)

(52) U.S. Cl. .............................. 385/92; 385/88; 385/89; 385/93

(58) Field of Classification Search ................ None
See application file for complete search history.

(56) References Cited

U.S. PATENT DOCUMENTS

| 6,731,882 B1 | 5/2004 | Althaus et al. | |
|---|---|---|---|
| 2004/0028352 A1* | 2/2004 | Sakurai et al. | ................ 385/92 |
| 2005/0141584 A1 | 6/2005 | Ohe et al. | |
| 2005/0184374 A1 | 8/2005 | Ohe et al. | |
| 2005/0254758 A1* | 11/2005 | Kropp | ......................... 385/89 |
| 2005/0286840 A1* | 12/2005 | Ho et al. | ...................... 385/92 |

FOREIGN PATENT DOCUMENTS

| DE | 19947889 | 5/2001 |
|---|---|---|
| DE | 10150986 | 4/2003 |
| JP | 2000-173947 A | 6/2000 |
| JP | 2002246653 | 8/2002 |

* cited by examiner

Primary Examiner—Sung Pak
(74) Attorney, Agent, or Firm—Birch, Stewart, Kolasch & Birch, LLP

(57) ABSTRACT

An optical semiconductor device 1a includes a lead frame 4 having a through hole 7, a semiconductor optical element 3 which is placed on one surface of the lead frame 4 for an optical portion 6 to face and overlap with the through hole 7, a first molding portion 9 of a non-transparent molding resin which covers the semiconductor optical element 3 and is placed on one surface of the lead frame 4, and a second molding portion 10 of a transparent molding resin which covers the through hole 7 and is placed on the other surface of the lead frame 4. An area of a confronting surface of the second molding portion 10 confronting the first molding portion 9 is smaller than an area of a confronting surface of the first molding portion 9 confronting the second molding portion 10.

17 Claims, 5 Drawing Sheets

OPTICAL SEMICONDUCTOR DEVICE, OPTICAL CONNECTOR AND ELECTRONIC EQUIPMENT

This nonprovisional application claims priority under 35 U.S.C. §119(a) on Patent Application No. 2004-217100 filed in Japan on Jul. 26, 2004, the entire contents of which are hereby incorporated by reference.

BACKGROUND OF THE INVENTION

The present invention relates to an optical semiconductor device having a semiconductor optical element, and to an optical connector and electronic equipment having the optical semiconductor device, and more particularly, relates to an optical semiconductor device for use in optical communication links and so forth for sending and receiving optical signals with an optical fiber as a transmission medium, and to an optical connector and electronic equipment having the optical semiconductor device.

Conventionally, there have been known optical semiconductor devices coupling semiconductor optical elements such as LEDs (Light Emitting Diodes) and PDs (Photo Diodes) to optical fibers, which have been used for optical communications between equipments, at home and in automobiles.

As such optical semiconductor devices, those manufactured utilizing transfer molding of transparent resin as shown in FIG. 9 are widely used. An optical semiconductor device 101 shown in FIG. 9 is structured such that a semiconductor optical element 103 disposed on a lead frame 104 is encapsulated with a transparent resin 110, and the semiconductor optical element 103 is optically coupled to an optical fiber 102 through a lens 108 formed out of part of the transparent resin 110. The semiconductor optical element 103 is electrically connected to the lead frame 104 via wire 105. Further, in some cases, a semiconductor device for driving and controlling the semiconductor optical element 103 is mounted on the lead frame 104. Such optical semiconductor devices utilizing transfer molding have a characteristic of being easily manufactured at low costs compared to, for example, optical semiconductor devices using a glass lens.

It is known that doping resin molding materials with fillers allows adjustment of a coefficient of linear expansion and heat conductivity, and so semiconductor elements which do not need an optical property are encapsulated with molding resins (normally black) added with fillers. Since the above-mentioned optical semiconductor device 101 using the transparent resin 110 put emphasis on the optical property, it was difficult to add the resin with a filler (or the resin is added only with a small amount of the filler), and so the optical semiconductor device 101 had a problem in environmental resistance (including thermal shock resistance and heat dissipation).

Accordingly, as shown in FIG. 10, there has been proposed an optical semiconductor device with a modified structure in which encapsulating is made by a color molding resin added with a filler (see, e.g., JP 2000-173947 A). In an optical semiconductor device 201 shown in FIG. 10, the semiconductor optical element 203 is mounted on a lead frame 204 with only an optical portion 206 thereof being adhered to a glass lens 208, and electrodes around the optical portion 206 of the semiconductor optical element 203 are electrically connected to the lead frame 204 via wire 205. Then, transfer molding is conducted with a color molding resin 209 added with a filler, which makes it possible to encapsulate the semiconductor optical element 203 and the wire 205 with the color molding resin 209 without the color molding resin 209 blocking an optical path through which light comes into and goes out from the semiconductor optical element 203.

As shown in FIG. 10, the optical semiconductor device is structured such that the glass lens 208 is mounted on the optical portion 206 and the semiconductor optical element 203 is encapsulated with the color molding resin 209 with a part of the glass lens 208 included in the color molding resin 209. However, a practical means to perform resin encapsulating with this structure is not disclosed in JP 2000-173947 A. Generally, resins for use in transfer molding are small particles, which induces a phenomenon of resin leaking from a space of several 1 μm. Therefore, it is considered to be difficult to realize such a structure stated in JP 2000-173947 A. Moreover, in the case of using a semiconductor optical element with a relatively large size (several mm to several dozen mm square) such as CCDs (Charge Coupled Devices), it is possible to dispose a glass lens on an optical portion. However, a semiconductor optical element with a small size (several hundred μm square) such as LEDs, which has an extremely small optical portion, needs to use a glass lens that is also extremely small in size, thereby causing problems including: (i) it is difficult to design a lens which can offer optical effects; (ii) it is difficult to manufacture a minute glass lens; and (iii) it is difficult to bond and align the optical portion and the glass lens. Further, if a glass lens that is larger than the optical portion of the semiconductor optical element is used, electrodes close to the optical portion of the semiconductor optical element are also bonded to the glass lens, which makes it impossible to conduct wire bonding.

For the above-stated optical semiconductor device, there has also been disclosed a method with use of a resin lens. However, in the case of using the semiconductor optical element having a small size such as LEDs, its optical portion is small and so there is difficulty in practical application due to the same reasons. Further, in the case of using the resin lens, due to the heat resistance of the lens, it is necessary to perform molding with a color molding resin before the resin lens is mounted, which makes it necessary to hold the optical portion of the semiconductor optical element and a mold by pressure contact or with a minute gap so as to prevent a color resin from coming into the optical portion of the semiconductor optical element. This necessitates damage prevention of the semiconductor optical element and high-accuracy mold management (as well as deformation prevention of a lead frame), bringing about difficulty in manufacturing. Particularly in the case of the semiconductor optical element with a small size such as LEDs, it is extremely difficult to manage so as to prevent the color molding resin from coming into the optical portion while protecting wires.

SUMMARY OF THE INVENTION

In consideration of the above situations, an object of the present invention is to provide an optical semiconductor device capable of offering excellent environment resistance and high reliability with a simple structure, achieving reduction in both size and price with high coupling efficiency, and using a semiconductor optical element with a small size such as LEDs and PDs.

In order to achieve the above object, according to the present invention, there is provided an optical semiconductor device comprising:

a lead frame having at least one through hole;

at least one semiconductor optical element which has an optical portion and which is placed on one surface of the lead frame for the optical portion to face the through hole and overlap with the through hole;

a first molding portion which covers the semiconductor optical element and which is made of a non-transparent molding resin placed on one surface of the lead frame; and a second molding portion which covers the through hole and which is made of a transparent molding resin placed on the other surface of the lead frame, wherein an area of a confronting surface of the second molding portion confronting the first molding portion is smaller than an area of a confronting surface of the first molding portion confronting the second molding portion.

Herein, the optical portion of the semiconductor optical element refers to, for example, a portion of the semiconductor optical element from which light of the semiconductor optical element is emitted, or a portion of the semiconductor optical element which receives light. For instance, the optical portion refers to a light-emitting surface in a case where the semiconductor optical element is an LED, and the optical portion refers to a light-receiving surface in another case where the semiconductor optical element is a PD.

The optical semiconductor device of the present invention includes the first molding portion which covers the semiconductor optical element and which is made of a non-transparent molding resin placed on one surface of the lead frame, and a second molding portion which covers the through hole and which is made of a transparent molding resin placed on the other surface of the lead frame. Therefore, for example, in a case where the semiconductor optical element is a light-receiving device, light passing through the second molding portion and through hole of the lead frame goes incident on the optical portion (light-receiving surface) of the semiconductor optical element. Meanwhile, in a case where the semiconductor optical element is a light-emitting device, light outputted from the optical portion (outgoing surface) of the semiconductor optical element is outputted via the through hole of the lead frame and the second molding portion.

Thus, with a simple constitution, encapsulating of the semiconductor optical element and the wire (which electrically connects the semiconductor optical element and the lead frame to each other) and the like can be achieved by the non-transparent molding resin, making it possible to realize an optical semiconductor device which is capable of expanding the working range at high temperatures and which is excellent in environment resistance and high in reliability. Besides, both size reduction and price reduction can be achieved at the same time with high coupling efficiency, and a semiconductor optical element of small size such as LED or PD can be utilized.

Since the area of the confronting surface of the second molding portion confronting the first molding portion is smaller than the area of the confronting surface of the first molding portion confronting the second molding portion, influence of the bimetal structure due to a difference in coefficient of linear expansion between the first molding portion and the second molding portion can be reduced so that the peeling and cracking of the resin can be prevented and the environment resistance can be improved.

In the optical semiconductor device of one embodiment, the non-transparent molding resin contains a filler.

According to the semiconductor optical element of this embodiment, since the non-transparent molding resin containing a filler is used for the first molding portion, it becomes possible to reduce differences in coefficient of linear expansion among the semiconductor optical element, the lead frame and the bonding wire. Thus, there can be fabricated an optical semiconductor device which is free from occurrence of disconnection of the bonding wire, package cracking and the like and which is high in reliability.

In one embodiment, the semiconductor optical elements include a light-emitting device and a light-receiving device, and the optical semiconductor device further comprises:

a signal processing circuit part for the light-emitting device which is placed on the lead frame and which is electrically connected to the light-emitting device; and a signal processing circuit part for the light-receiving device which is placed on the lead frame and which is electrically connected to the light-receiving device.

According to the optical semiconductor device of this embodiment, the light-emitting device, the light-receiving device, the signal processing circuit part for the light-emitting device and the signal processing circuit part for the light-receiving device can be placed on the lead frame. Thus, integration of signal transmitting means and signal receiving means is enabled, allowing the device downsizing to be achieved.

In one embodiment, the through holes of the lead frame include a through hole for the light-emitting device confronting the light-emitting device and a through hole for the light-receiving device confronting the light-receiving device, the second molding portion has a signal transmitting part which covers the through hole for the light-emitting device and a signal receiving part which covers the through hole for the light-receiving device, and the signal transmitting part and the signal receiving part are separated from each other.

According to the optical semiconductor device of this embodiment, since the signal transmitting part of the second molding portion and the signal receiving part of the second molding portion are separated from each other, the light-emitting device and the light-receiving device are optically isolated from each other. Thus, a good S/N ratio can be obtained and internal stress due to the bimetal structure of the first molding portion and the second molding portion can be even more reduced so that the environment resistance can be even more improved.

In one embodiment, the through holes of the lead frame include a through hole for the light-emitting device confronting the light-emitting device and a through hole for the light-receiving device confronting the light-receiving device, the second molding portion has a signal transmitting part which covers the through hole for the light-receiving device, a signal receiving part which covers the through hole for the light-receiving device, and a coupling portion which couples the signal transmitting part and the signal receiving part to each other, and the coupling portion has a recessed portion.

According to the optical semiconductor device of this embodiment, since the coupling portion of the second molding portion has the recessed portion, the second molding portion can be made smaller in configuration so that the internal stress due to the bimetal structure of the first molding portion and the second molding portion can be even further reduced, and that the environment resistance can be even further improved.

In one embodiment, the signal processing circuit part for the light-emitting device and the signal processing circuit part for light-receiving device are included in one chip.

According to the optical semiconductor device of this embodiment, since the signal processing circuit part for the light-emitting device and the signal processing circuit part for the light-receiving device are included in one chip, a further device downsizing can be achieved.

One embodiment further comprises a submount placed between the semiconductor optical element and the lead frame.

According to the optical semiconductor device of this embodiment, heat generated in the semiconductor optical element can be radiated by the submount, so that the reliability can be improved.

One embodiment further comprises a buffering member which is made of an elastic resin having optical transparency and which is placed between the first molding portion and the second molding portion.

According to the optical semiconductor device of this embodiment, since the buffering member is placed between the first molding portion and the second molding portion, the internal stress due to the bimetal structure of the first molding portion and the second molding portion can be even more reduced, so that the environment resistance can be even more improved.

In one embodiment, the elastic resin of the buffering member is silicone resin having a glass transition temperature lower than a lowest operating temperature ensured by the optical semiconductor device.

According to the optical semiconductor device of this embodiment, the buffering member is excellent in adhesion and besides has a function of relaxing the thermal stress of the first molding portion and the second molding portion by maintaining the elasticity even at the lowest operating temperature ensured by the optical semiconductor device.

In one embodiment, the semiconductor optical element includes a light-emitting device, and the light-emitting device is a vertical cavity surface emitting laser.

According to the optical semiconductor device of this embodiment, since the light-emitting device is the vertical cavity surface emitting laser, higher-speed optical transmission by PCS (Polymer Clad Silica) fiber can be realized.

In one embodiment, the molding resin of the second molding portion is an almost transparent resin containing a filler.

According to the optical semiconductor device of this embodiment, since the molding resin of the second molding portion contains a filler, the coefficient of linear expansion of the second molding portion can be lowered, so that the internal stress due to the bimetal structure of the first molding portion and the second molding portion can be even further reduced, and that the environment resistance can be even further improved.

In one embodiment, the second molding portion has a lens.

According to the optical semiconductor device of this embodiment, since the second molding portion has the lens, the lens can be made larger than the through hole of the lead frame, so that the coupling efficiency between the semiconductor optical element and the optical fiber can be increased.

In one embodiment, the semiconductor optical element includes a light-emitting device, and the submount between the light-emitting device and the lead frame is a silicon submount having a tapered hole.

According to the optical semiconductor device of this embodiment, since the submount is the silicon submount having the tapered hole, light emission efficiency can be improved by reflection at the inner wall of the tapered hole of the submount.

Also, in the optical semiconductor device of one embodiment, the tapered hole is conical or pyramidal shaped.

In one embodiment, the semiconductor optical element includes a light-receiving device, and the submount between the light-receiving device and the lead frame is a glass submount.

According to the optical semiconductor device of this embodiment, since the submount is the glass submount, light can reliably be received by the light-receiving device by virtue of the transparent glass.

In one embodiment, the molding resin of the first molding portion is subjected to curing process simultaneously with the molding resin of the second molding portion after molding process of the molding resin of the second molding portion.

According to the optical semiconductor device of this embodiment, the close adhesion between the first molding portion and the second molding portion can be improved by the relationship of chemical conversion reaction between the molding resin of the first molding portion and the molding resin of the second molding portion.

In one embodiment, end portions of the second molding portion is chamfered.

According to the optical semiconductor device of this embodiment, since the end portions of the second molding portion are chamfered, occurrence of cracking and resin peeling due to internal stress can be prevented.

Also, in the optical semiconductor device of one embodiment, the chamfered end portions of the second molding portion are shaped into a round surface or a taper surface.

Also, an optical connector of one embodiment includes the optical semiconductor device described above.

According to the optical connector of this embodiment, since the optical semiconductor device is included therein, the optical connector is excellent in environment resistance and capable of improving the reliability and realizing size and cost reductions.

Further, electronic equipment of one embodiment includes the optical semiconductor device described above.

According to the electronic equipment of this embodiment, since the optical semiconductor device is included therein, the electronic equipment is excellent in environment resistance and capable of improving the reliability and realizing size and cost reductions.

According to the optical semiconductor device of the present invention, even in cases where a small-sized semiconductor optical element such as LED and PD is used, with a simple constitution, encapsulating of the semiconductor optical element and the wire can be achieved by the non-transparent molding resin of excellent environment resistance, making it possible to realize an optical semiconductor device which is prevented as much as possible from influence of the bimetal and which is low in price, excellent in environment resistance and high in reliability.

Also, according to the optical connector of the present invention, since the optical semiconductor device described above is included therein, the optical connector is excellent in environment resistance and capable of improving the reliability and realizing size and cost reductions.

Also, according to the electronic equipment of the present invention, since the optical semiconductor device is included therein, the electronic equipment is excellent in environment resistance and capable of improving the reliability and realizing size and cost reductions.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the present invention is described in more detail by embodiments thereof illustrated in the accompanying drawings.

FIRST EMBODIMENT

Figure 1:
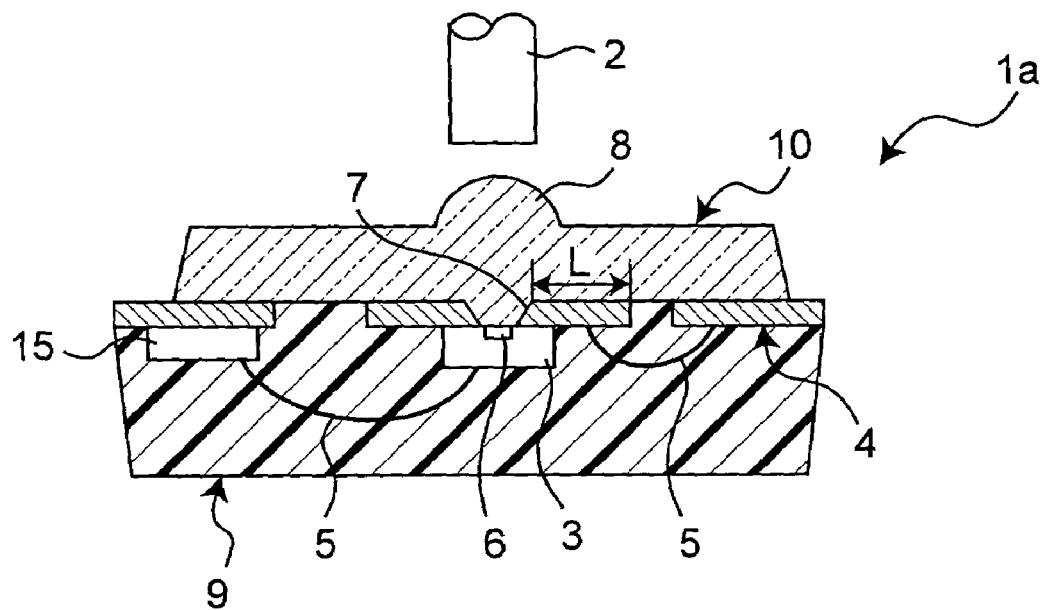
FIG. 1 is a schematic sectional view showing an outlined structure of an optical semiconductor device according to a first embodiment of the present invention.
Figure 2:
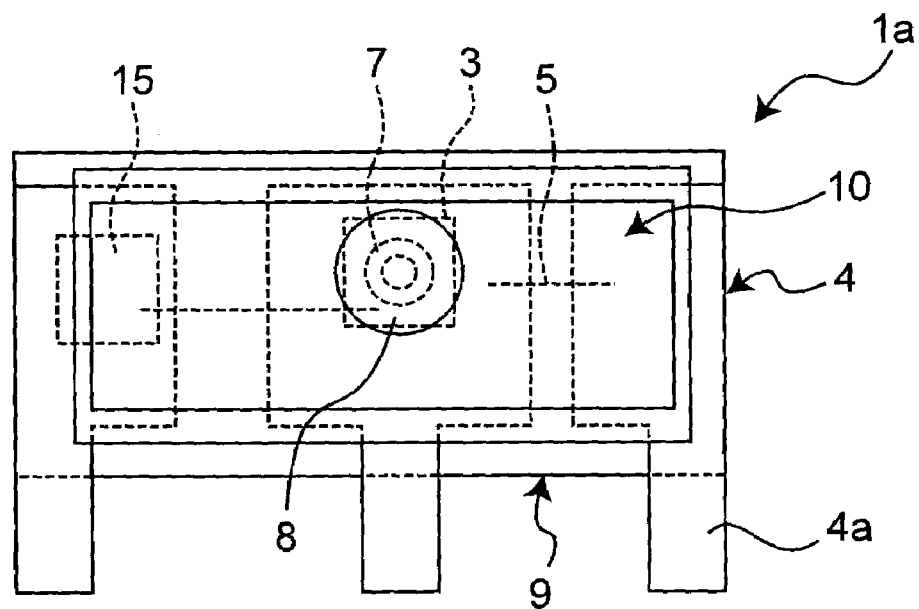
FIG. 2 is a front view showing an outlined structure of the optical semiconductor device according to the first embodiment of the present invention.

FIG. 1 is a schematic sectional view showing an outlined structure of an optical semiconductor device according to a first embodiment of the present invention. FIG. 2 is a front view of the optical semiconductor device as viewed from the lens side.

As shown in FIGS. 1 and 2, the optical semiconductor device 1a includes a lead frame 4 having a through hole 7, a semiconductor optical element 3 which is mounted on one side (rear surface) of the lead frame 4, a first molding portion 9 made of non-transparent molding resin which covers the semiconductor optical element 3 and which is placed on the one side of the lead frame 4, and a second molding portion 10 made of transparent molding resin which covers the through hole 7 and which is placed on the other side (front surface) of the lead frame 4.

The semiconductor optical element 3 has an optical portion 6, and the optical portion 6 is so placed as to face the through hole 7 and overlap with the through hole 7. The optical portion 6 herein refers to a portion for emitting light or a portion for receiving light of the semiconductor optical element 3, which represents, for example, a light-emitting face in LEDs and a light-receiving face in PDs.

The semiconductor optical element 3 is bonded to the lead frame 4 in the state of having electric conduction thereto with the optical portion 6 facing the lead frame 4 in the direction opposite to the normal disposition direction (face-down layout).

A driver circuit 15 for driving and controlling the semiconductor optical element 3 is placed on one face of the lead frame 4. One face (rear surface) of the semiconductor optical element 3 opposite to a face (front surface) on which the optical portion 6 is provided, one face (front surface) of the lead frame 4, and the driver circuit 15 are electrically coupled to one another by means of wire 5.

The first molding portion 9, which is optimized in coefficient of linear expansion and thermal conductivity and excellent in environment resistance with a filler added thereto, covers the semiconductor optical element 3, the wire 5 and the driver circuit 15.

The second molding portion 10, excellent in optical characteristics, covers the other face of the lead frame 4. Also, the second molding portion 10 has a lens 8 that optically couples the semiconductor optical element 3 and an optical fiber 2 to each other. Then, the semiconductor optical element 3 is optically coupled to the optical fiber 2 via the through hole 7 of the lead frame 4 and the lens 8 of the second molding portion 10. Thus, the lens 8 can be made larger than the through hole 7 of the lead frame 4 and the coupling efficiency between the semiconductor optical element 3 and the optical fiber 2 can be increased.

Next, a fabrication method of the optical semiconductor device 1a is explained. First, the semiconductor optical element 3 is bonded to the lead frame 4 so that the optical portion 6 of the semiconductor optical element 3 faces the through hole 7 of the lead frame 4. In this process, the bonding of the semiconductor optical element 3 and the lead frame 4, which is a bonding such as Ag paste, solder or gold eutectic bonding having electrical conductivity, is implemented so that an electrode formed on the face (front surface) of the optical portion 6 side of the semiconductor optical element 3 and the lead frame 4 are electrically connected to each other. After that, a rear-face electrode of the semiconductor optical element 3 and the lead frame 4 are electrically connected to each other via the wire 5 by wire bonding.

Next, the first molding portion 9 is transfer molded. In this process, the lead frame 4 is pressed at its front surface side by the metal mold so as to prevent the non-transparent molding resin of the first molding portion 9 from going around to the front surface side of the lead frame 4. Generally, because of distortion of the lead frame 4 or the like, the molding resin cannot be completely inhibited from going around, and therefore there are some cases where flash of the molding resin occurs to part of the lead frame 4.

In the present invention, since the lead frame 4 having a specified width L is present around the through hole 7 of the lead frame 4, it is possible to prevent the molding resin from going around to the through hole 7 even with the occurrence of the flash, eliminating the need for high-precision control of the metal mold and the lead frame 4. That is, even if flash occurs to portions other than the through hole 7, it does not matter, and optical path shielding by flash can easily be prevented by the lead frame 4 (with the specified width L) provided around the through hole 7. Accordingly, the device can be fabricated even with use of a small-sized device such as LED and PD as the semiconductor optical element 3. Further, since the lead frame 4 is pressed by the metal mold, the semiconductor optical element 3 is never damaged.

Then, after the formation of the first molding portion 9, the second molding portion 10 is transfer molded, by which the optical semiconductor device 1a is completed. In the case where the resin of the first molding portion 9 and the second molding portion 10 is epoxy resin, after the molding resin of the first molding portion 9 is molded, transfer-molding of the molding resin of the second molding portion 10 without performing the curing process by heating or the like allows the close bond to be achieved by the relation of chemical conversion reaction between the first molding portion 9 and the second molding portion 10. That is, the molding resin of the first molding portion 9 is cured simultaneously with the molding resin of the second molding portion 10 after the molding of the molding resin of the second molding portion 10.

An area of a confronting surface of the second molding portion 10 confronting the first molding portion 9 is smaller than an area of a confronting surface of the first molding portion 9 confronting the second molding portion 10. Thus, it is implementable to reduce influence of the bimetal structure due to any difference in coefficient of linear expansion between the first molding portion 9 and the second molding portion 10 and to reduce the internal stress occurring due to the bimetal structure, so that the peeling and cracking of the resin can be prevented and the environment resistance can be improved.

End portions of the second molding portion 10 are chamfered. More specifically, the end portions of the chamfered second molding portion 10 are shaped into a round surface (not shown) or a slope surface (taper portion). Thus, occurrence of cracking and resin peeling due to internal stress can be prevented.

Further, the molding resin of the second molding portion 10 is injected also into the through hole 7. With an LED used as the semiconductor optical element 3, covering the optical portion 6 of the LED with the molding resin of the second molding portion 10, which is higher in refractive index than air, makes it possible to improve the external quantum efficiency of the LED.

Preferably, the through hole 7 of the lead frame 4 is formed as a pyramidal hole which is so tapered as to decrease in diameter with approaching one side on which the semiconductor optical element 3 is placed. In the case where an LED is used as the semiconductor optical element 3, light of narrower radiation angles out of radiated light passes through the through hole 7, being incident on the lens 8 and refracted to be coupled with optical fiber 2. Meanwhile, light of wider radiation angles out of the light radiated from the semiconductor optical element 3 is reflected by the taper portion of the through hole 7, then being incident on the lens 8 and refracted so as to be coupled with the optical fiber 2. Thus, even if an LED or the like of wide radiation angle is used as the semiconductor optical element 3, the light emitted from the semiconductor optical element 3 can be coupled with the optical fiber 2 with high efficiency. Also, even when a PD is used as the semiconductor optical element 3, making incident light reflected by the taper portion of the through hole 7 allows a light focusing effect to be obtained.

The through hole 7 can be formed by etching, press working or the like simultaneously with the patterning process of the lead frame 4. Therefore, an optical semiconductor device 1a of low price can be obtained without increasing the price. In addition, it is preferable to form a reference hole (not shown) for aligning the semiconductor optical element 3, the lens 8 and the optical fiber 2 simultaneously in the process of forming the through hole 7.

Using such a reference hole as an assembly reference of the optical semiconductor device 1a for aligning the through hole 7, the semiconductor optical element 3, lens 8 and the optical fiber 2 allows the device to be assembled with high precision.

Further, making the semiconductor optical element 3 placed face down on the lead frame 4 allows an additional effect that heat radiation characteristics of the semiconductor optical element 3 can be improved. For example, when an LED is used as the semiconductor optical element 3, heat would be generated at the active layer (optical portion 6) of the top layer of the LED. Whereas poor heat radiation characteristics would result with the conventional face-up layout (a layout that the substrate is adhesively bonded to the lead frame 4) because of a high heat resistance of the substrate (e.g., GaAs), adopting the face-down layout allows heat to be radiated directly to the lead frame 4 without passing via the substrate, so that the heat radiation characteristics of the semiconductor optical element 3 can be improved.

For the bonding of the semiconductor optical element 3 and the lead frame 4, it is preferable to use, for example, an adhesive of high electrical conductivity such as silver paste. Among adhesives of high electrical conductivity, it is more preferable to use adhesives composed of materials or thin film of high thermal conductivity which are capable of obtaining enough thermal contact and absorbing a difference in coefficient of linear expansion between the lead frame 4 and the semiconductor optical element 3.

In addition, the adhesive needs to be prevented from adhering to the optical portion 6 of the semiconductor optical element 3. By preparatorily forming a thin film of the adhesive on the surface of the semiconductor optical element 3 in a portion other than the optical portion 6 by photolithography or other technique, the adhesive can reliably be prevented from adhering to the optical portion 6.

Usable as the semiconductor optical element 3 are LED, PD, VCSEL (Vertical-Cavity Surface-Emitting Laser), CCD, or OPIC in which these semiconductor optical elements 3 and ICs are integrated. The light wavelength of the semiconductor optical element 3 is preferably one which causes less transmission loss of the optical fiber 2 to be used.

When a VCSEL having an emission wavelength of around 850 nm is used as the semiconductor optical element 3, a PCS (Polymer Clad Silica) fiber with a core made of glass and a clad made of resin may be used, where even higher speed transmission over POF (Plastic Optical Fiber) can be realized.

As the lead frame 4, a sheet-like metal plate made of a metal having electrical conductivity and high in thermal conductivity such as copper and its alloy, 42 alloy or the like is subjected to formation of the through hole 7 by etching, pressing, cutting work or the like and to surface plating by silver, gold or the like so that a high reflectivity can be obtained.

It is noted here that the term, lead frame 4, refers to a sheet-like metal plate that fulfills the roles of mounting thereon and supporting component parts such as the semiconductor optical element 3 and the driver circuit 15 and transmitting electricity to individual parts. Of course, for example, various boards such as stem and printed circuit boards may be used instead of the lead frame 4.

As the optical fiber 2, for example, a multi-mode optical fiber such as POF (Plastic Optical Fiber) or GOF (Glass Optical Fiber) is preferably used. The POF has a core made of plastic excellent in optical transparency such as PMMA (Polymethyl Methacrylate) or polycarbonate and a clad made of plastic lower in refractive index than the core. The POF, which can be more easily made to have a core diameter as large as about 200 μm to about 1 mm as compared with GOF, can be more easily adjusted for coupling with the optical semiconductor device 1a, so that a lower-priced optical communications link can be obtained. Further, a PCF (Polymer Clad Fiber) having a core made of quartz glass and a clad made of polymer is also usable. The PCF, although higher in price than POF, is characterized by small transmission loss and wide transmission band. Therefore, with the PCF used as the transmission medium, it becomes possible to obtain an optical communications link which allows longer distance communications and higher-speed communications to be performed.

The molding resin of the first molding portion 9 is given by using a material which is obtained by adding a filler to epoxy resin or the like generally used for the encapsulating of semiconductor devices, and a material which is a coefficient of linear expansion closer to those of the semiconductor optical element 3 (Si or GaAs) and the wire 5 (Au or Al) and which is high in thermal conductivity. For instance, when the coefficient of linear expansion of the semiconductor optical element 3 is $2.8 \times 10^{-6}/°$ C. (Si) and the coefficient of linear expansion of the wire 5 is $14.2 \times 10^{-6}/°$ C. (Au), the coefficient of linear expansion of the resin of the first molding portion 9 is preferably set to $20 \times 10^{-6}/°$ C. or lower (normally, the coefficient of linear expansion of epoxy resin with no filler added is about $60 \times 10^{-6}/°$ C.). Also, the thermal conductivity of the resin of the first molding portion 9 is preferably set to 0.6 W/° C. (normally, the thermal conductivity of epoxy resin with no filler added is about 0.2 W/° C.).

Generally, when two kinds of molding resins different in expansion coefficient from each other are brought into close contact with each other, there occurs internal thermal stress by influence of the bimetal structure, which causes, for example, cracking or peeling in the thermal cycle test. Therefore, in the present invention, as shown in FIG. 2, the area of the confronting surface of the second molding portion 10 confronting the first molding portion 9 is set 70% or less of the area of the confronting surface of the first molding portion 9 confronting the second molding portion 10.

Next, preferable sizes of individual members are explained. In the case where the semiconductor optical element 3 is an LED, the element size is about several hundred μm square and the optical portion 6 is 100 μm in diameter. In the case where the semiconductor optical element 3 is a PD, the element size is about 1 mm square and the optical portion 6 is several hundred μm to 1 mm in diameter (where the size of the optical portion 6 may differ depending on the communication speed or the like). Also, the thickness of the lead frame 4 is about 100 to 500 μm, and the smaller diameter of the through hole 7 is set in accordance with the size of the optical portion 6 of the semiconductor optical element 3. The specified width L of the lead frame 4 around the through hole 7 is preferably set to about several hundred μm to several mm in order to prevent the resin of the first molding portion 9 from going around to the through hole 7. The first molding portion 9 and the second molding portion 10 are formed to a thickness of about 1 mm.

According to the optical semiconductor device of this constitution, since the semiconductor optical element 3 is face-down placed for the optical portion 6 to face the through hole 7 of the lead frame 4, the resin of the first molding portion 9 can simply be prevented by the lead frame 4 from shielding the optical portion 6 of the semiconductor optical element 3 or the optical path. Thus, with a low-cost manufacturing method and a simple constitution, there can be obtained an effect that encapslating of the semiconductor optical element 3 and the wire 5 can be achieved by the resin of the first molding portion 9 having a filler added thereto and excellent in environment resistance. Still, internal stress due to the bimetal structure of the resin of the first molding portion 9 and the resin of the second molding portion 10 can be reduced.

SECOND EMBODIMENT

Figure 3:
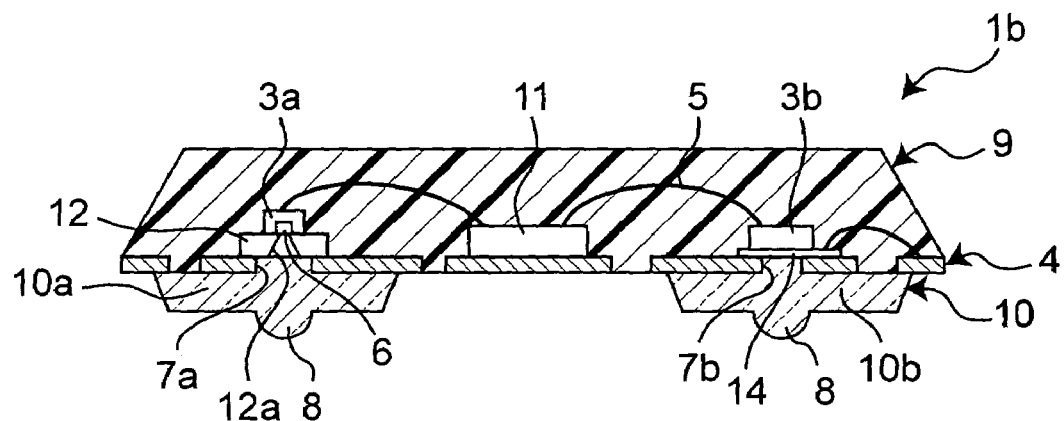
FIG. 3 is a schematic sectional view showing an outlined structure of an optical semiconductor device according to a second embodiment of the present invention.
Figure 4:
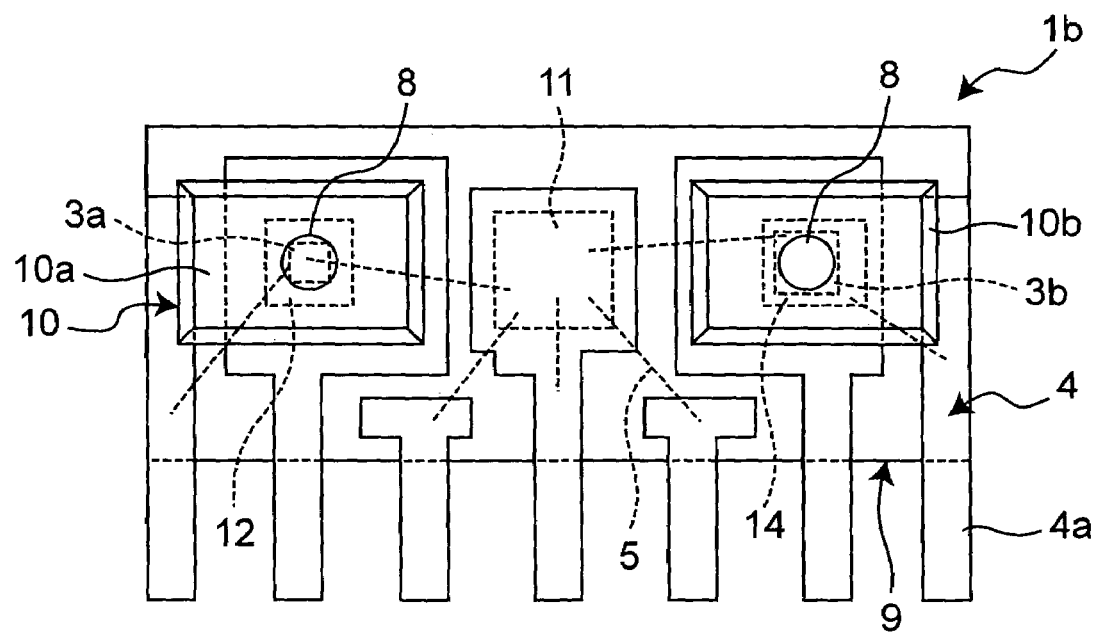
FIG. 4 is a front view showing an outlined structure of the optical semiconductor device according to the second embodiment of the present invention.

FIG. 3 is a schematic sectional view showing an outlined structure of an optical semiconductor device according to a second embodiment of the present invention. FIG. 4 is a front view of the optical semiconductor device as viewed from the lens side. It is noted that constituent parts having the same functions as those shown in the first embodiment are designated by the same reference numerals as those of the first embodiment, and their description is omitted.

The optical semiconductor device 1b of this second embodiment includes a light-emitting device 3a and a light-receiving device 3b as semiconductor optical elements, as well as a through hole 7a serving for the light-emitting device 3a and confronting the light-emitting device 3a and a through hole 7b serving for the light-receiving device 3b and confronting the light-receiving device 3b as through holes of the lead frame 4. The second molding portion 10 has a signal transmitting part 10a that covers the through hole 7a for the light-emitting device 3a, and a signal receiving part 10b that covers the through hole 7b for the light-receiving device 3b, where the signal transmitting part 10a and the signal receiving part 10b are separated from each other.

As shown above, since the signal transmitting part 10a and the signal receiving part 10b are separated from each other, the light-emitting device 3a and the light-receiving device 3b are optically isolated from each other, so that a good S/N ratio can be obtained. Moreover, the internal stress due to the bimetal structure of the first molding portion 9 and the second molding portion 10 can be even more reduced, so that the environment resistance can be even more improved.

Further, the optical semiconductor device 1b has a signal processing circuit part for a light-emitting device which is placed on the lead frame 4 and electrically connected to the light-emitting device 3a, and a signal processing circuit part for a light-receiving device which is placed on the lead frame 4 and electrically connected to the light-receiving device 3b. The signal processing circuit part for the light-emitting device and the signal processing circuit part for the light-receiving device are included in one chip, constituting a signal processing circuit part 11 for both light-emitting device and light-receiving device.

As shown above, the light-emitting device 3a, the light-receiving device 3b and the signal processing circuit part 11 are placed on the lead frame 4, making it possible to integrate signal transmitting means and signal receiving means together, allowing a device downsizing to be achieved. Besides, since the signal processing circuit part 11 is provided as one chip, further device downsizing can be achieved.

Furthermore, the optical semiconductor device 1b has a submount 12 for the light-emitting device between the light-emitting device 3a and the lead frame 4. The submount 12 for the light-emitting device is a silicon submount having a tapered hole 12a. The tapered hole 12a is, for example, conical or pyramidal shaped. The tapered hole 12a is formed by using anisotropic etching of Si. Thus, the light emission efficiency are improved by reflection at the inner wall of the tapered hole 12a of the submount 12.

Furthermore, the optical semiconductor device 1b has a submount 14 for the light-receiving device between the light-receiving device 3b and the lead frame 4. The submount 14 for the light-receiving device is a glass submount. The submount 14 for the light-receiving device has an electrode and pattern for use of electric circuit connection of the light-receiving device 3b. Thus, by virtue of the light-pervious glass, light reception can be fulfilled by the light-receiving device 3b with reliability.

THIRD EMBODIMENT

Figure 5:
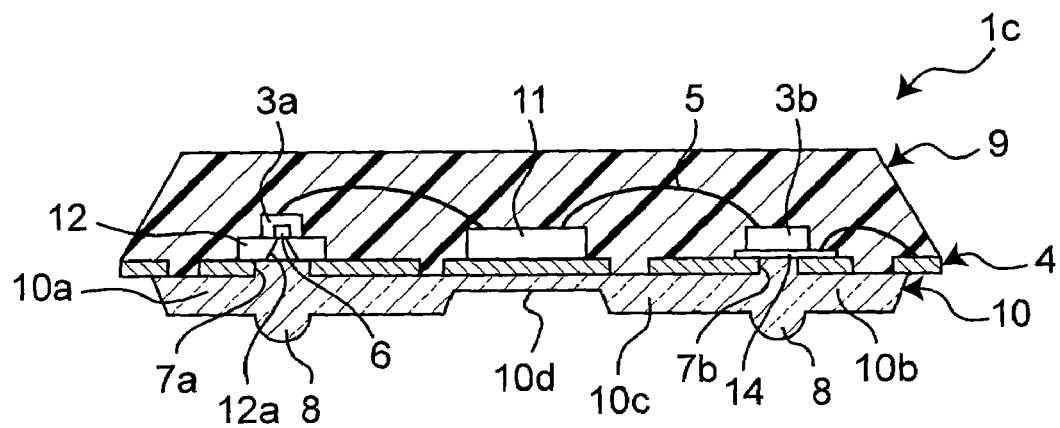
FIG. 5 is a schematic sectional view showing an outlined structure of an optical semiconductor device according to a third embodiment of the present invention.
Figure 6:
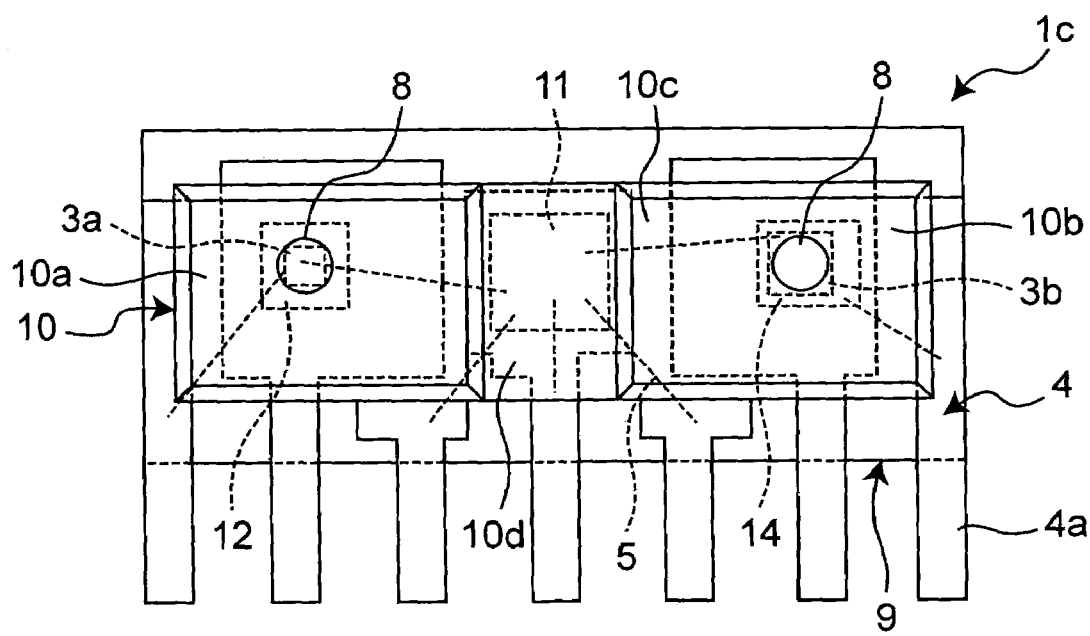
FIG. 6 is a front view showing an outlined structure of the optical semiconductor device according to the third embodiment of the present invention.

FIG. 5 is a schematic sectional view showing an outlined structure of an optical semiconductor device according to a third embodiment of the present invention. FIG. 6 is a front view of the optical semiconductor device as viewed from the lens side. It is noted that constituent parts having the same functions as those shown in the second embodiment are designated by the same reference numerals as those of the second embodiment, and their description is omitted.

In the optical semiconductor device 1c of this third embodiment, a second molding portion 10 has a signal transmitting part 10a that covers a through hole 7a for a light-emitting device, a signal receiving part 10b that covers a through hole 7b for a light-receiving device, and a coupling portion 10c for coupling the signal transmitting part 10a and the signal receiving part 10b to each other, where the coupling portion 10c has a recessed portion 10d.

Thus, since the coupling portion 10c has the recessed portion 10d, the second molding portion 10 can be made smaller in configuration so that the internal stress due to the bimetal structure of the first molding portion 9 and the second molding portion 10 can be even further reduced, and that the environment resistance can be even further improved.

Furthermore, in this optical semiconductor device 1c, the molding resin of the second molding portion 10 is a generally transparent resin containing a filler. Thus, since the molding resin of the second molding portion 10 contains a filler, the coefficient of linear expansion of the second molding portion 10 can be lowered, so that the internal stress due to the bimetal structure of the first molding portion 9 and the second molding portion 10 can be even further reduced, and that the environment resistance can be even further improved.

FOURTH EMBODIMENT

Figure 7:
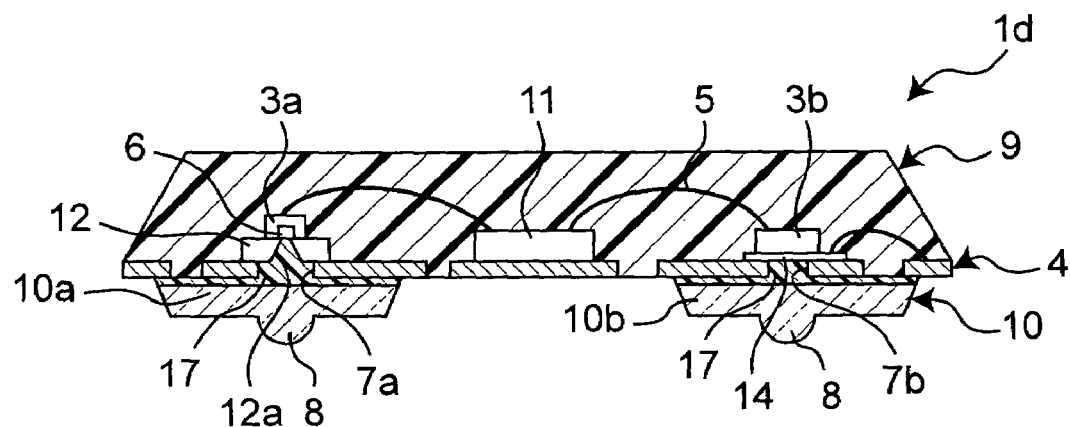
FIG. 7 is a schematic sectional view showing an outlined structure of an optical semiconductor device according to a forth embodiment of the present invention.
Figure 8:
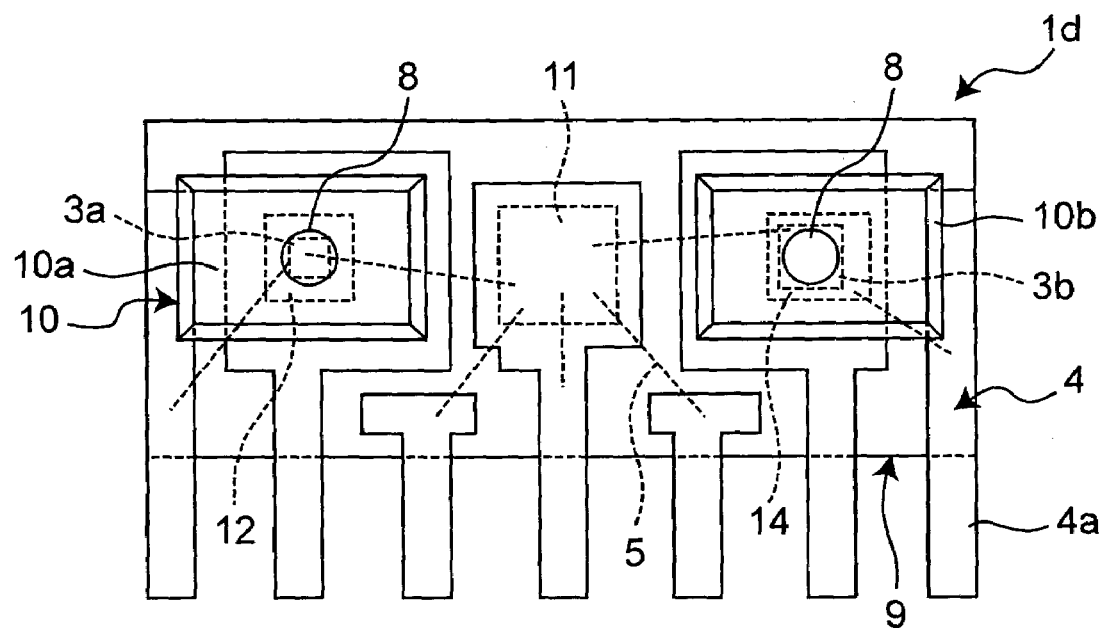
FIG. 8 is a front view showing an outlined structure of the optical semiconductor device according to the forth embodiment of the present invention.
Figure 9:
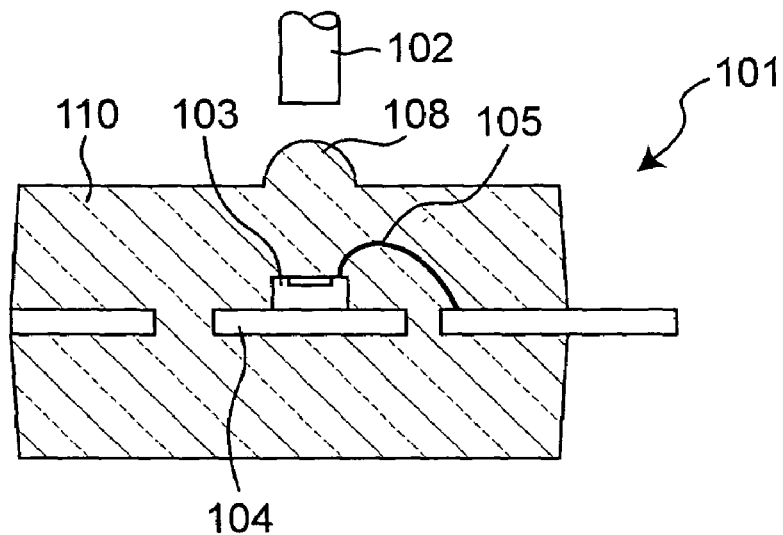
FIG. 9 is a sectional view showing an outlined structure of a conventional optical semiconductor device.
Figure 10:
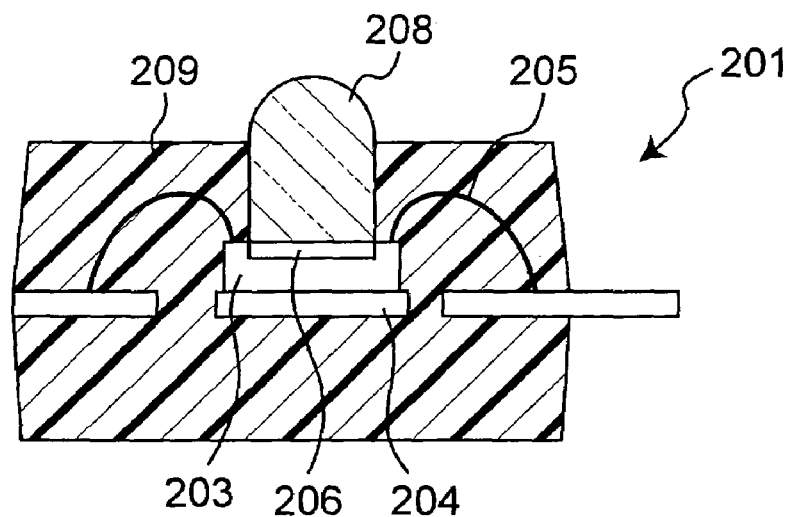
FIG. 10 is a sectional view showing an outlined structure of another conventional optical semiconductor device.

FIG. 7 is a schematic sectional view showing an outlined structure of an optical semiconductor device according to a fourth embodiment of the present invention. FIG. 8 is a front view of the optical semiconductor device as viewed from the lens side. It is noted that constituent parts having the same functions as those shown in the second embodiment are designated by the same reference numerals as those of the second embodiment, and their description is omitted.

The optical semiconductor device 1d of this fourth embodiment includes a buffering member 17 between a first molding portion 9 and a second molding portion 10, the buffering member 17 being made of an elastic resin having optical transparency. Thus, since the buffering member 17 is provided between the first molding portion 9 and the second molding portion 10, the internal stress due to the bimetal structure of the first molding portion 9 and the second molding portion 10 can be even further reduced, so that the environment resistance can be even further improved.

Furthermore, in this optical semiconductor device 1d, the elastic resin of the buffering member 17 is a silicone resin having a glass transition temperature (e.g., −40° C.) lower than the lowest operating temperature ensured by the optical semiconductor device. Thus, the buffering member 17 is excellent in adhesion and besides has a function of relaxing the thermal stress of the first molding portion 9 and the second molding portion 10 by maintaining the elasticity even at the lowest operating temperature ensured by the optical semiconductor device 1d.

The optical semiconductor device of the present invention is to be used for optical connectors. These optical connectors, having the optical semiconductor device as described above, are excellent in environment resistance and capable of improving the reliability and realizing size and cost reductions.

The optical semiconductor device of the present invention is used in electronic equipment such as digital TV (televisions) sets, digital BS (Broadcasting Satellite) tuners, CS (Communication Satellite) tuners, DVD (Digital Versatile Disc) players, super audio CD (Compact Disc) players, AV (Audio Visual) amplifiers, audios, personal computers, personal computer peripherals, cellular phones and PDAs (Personal Digital Assistants). The optical semiconductor device of the present invention is also used in electronic equipment in the environment with a wide operating temperature range, for instance, in-car equipment such as car audios, automotive navigation systems and sensors, as well as factory robot sensors and control equipment. According to the electronic equipment of the present invention, since the optical semiconductor device is included therein, the electronic equipment is excellent in environment resistance and capable of improving the reliability and realizing size and cost reductions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical semiconductor device, comprising:
a lead frame having at least two through holes;
at least one semiconductor optical element which has an optical portion and which is placed on one surface of the lead frame for the optical portion to face at least one of the through holes and overlap with the at least one of the through holes;
a first molding portion which covers the semiconductor optical element and which is made of a non-transparent molding resin placed on one surface of the lead frame; and
a second molding portion which covers the through hole and which is made of a transparent molding resin placed on the other surface of the lead frame, an expansion coefficient of the second molding portion being different from an expansion coefficient of the first molding portion, wherein
wherein, the first molding portion and the second molding portion make contact with one another through at least one of the at least two through holes, and
an area of a confronting surface of the second molding portion confronting the first molding portion is smaller than an area of a confronting surface of the first molding portion confronting the second molding portion.

2. The optical semiconductor device as defined in claim 1, wherein
the at least one semiconductor optical element includes a light-emitting device and a light-receiving device, and further comprising:
a signal processing circuit part for the light-emitting device which is placed on the lead frame and which is electrically connected to the light-emitting device; and
a signal processing circuit part for the light-receiving device which is placed on the lead frame and which is electrically connected to the light-receiving device.

3. The optical semiconductor device as defined in claim 2, wherein
the at least two through holes of the lead frame include a through hole for the light-emitting device confronting the light-emitting device and a through hole for the light-receiving device confronting the light-receiving device,
the second molding portion has a signal transmitting part which covers the through hole for the light-emitting device and a signal receiving part which covers the through hole for the light-receiving device, and
the signal transmitting part and the signal receiving part are separated from each other.

4. The optical semiconductor device as defined in claim 2, wherein
the at least two through holes of the lead frame include a through hole for the light-emitting device confronting the light-emitting device and a through hole for the light-receiving device confronting the light-receiving device,
the second molding portion has a signal transmitting part which covers the through hole for the light-receiving device, a signal receiving part which covers the through hole for the light-receiving device, and a coupling portion which couples the signal transmitting part and the signal receiving part to each other, and
the coupling portion has a recessed portion.

5. The optical semiconductor device as defined in claim 2, wherein
the signal processing circuit part for the light-emitting device and the signal processing circuit part for light-receiving device are included in one chip.

6. The optical semiconductor device as defined in claim 1, further comprising:
a submount placed between the semiconductor optical element and the lead frame.

7. The optical semiconductor device as defined in claim 1, further comprising
a buffering member which is made of an elastic resin having optical transparency and which is placed between the first molding portion and the second molding portion.

8. The optical semiconductor device as defined in claim 7, wherein
the elastic resin of the buffering member is silicone resin having a glass transition temperature lower than a lowest operating temperature ensured by the optical semiconductor device.

9. The optical semiconductor device as defined in claim 1, wherein
the semiconductor optical element includes a light-emitting device, and
the light-emitting device is a vertical cavity surface emitting laser.

10. The optical semiconductor device as defined in claim 1, wherein
the molding resin of the second molding portion is an almost transparent resin containing a filler.

11. The optical semiconductor device as defined in claim 1, wherein
the second molding portion has a lens.

12. The optical semiconductor device as defined in claim 6, wherein
the semiconductor optical element includes a light-emitting device, and
the submount between the light-emitting device and the lead frame is a silicon submount having a tapered hole.

13. The optical semiconductor device as defined in claim 6, wherein
the semiconductor optical element includes a light-receiving device, and
the submount between the light-receiving device and the lead frame is a glass submount.

14. The optical semiconductor device as defined in claim 1, wherein
the molding resin of the first molding portion is subjected to curing process simultaneously with the molding resin of the second molding portion after molding process of the molding resin of the second molding portion.

15. The optical semiconductor device as defined in claim 1, wherein
end portions of the second molding portion is chamfered.

16. An optical connector which includes the optical semiconductor device as defined in claim 1.

17. Electronic equipment which includes the optical semiconductor device as defined in claim 1.

* * * * *